United States Patent
Conte et al.

(10) Patent No.: US 9,502,115 B2
(45) Date of Patent: Nov. 22, 2016

(54) AMPLIFIER STAGE

(71) Applicant: STMICROELECTRONICS S.R.L., Agrate Brianza (IT)

(72) Inventors: Antonino Conte, Tremestieri Etneo (IT); Maria Giaquinta, Catania (IT)

(73) Assignee: STMICROELECTRONICS S.R.L., Agrate Brianza (MB) (IT)

( * ) Notice: Subject to any disclaimer, the term of this patent is extended or adjusted under 35 U.S.C. 154(b) by 25 days.

(21) Appl. No.: 14/640,236

(22) Filed: Mar. 6, 2015

(65) Prior Publication Data
US 2015/0279467 A1 Oct. 1, 2015

(30) Foreign Application Priority Data

Mar. 28, 2014 (IT) .............................. MI2014A0546

(51) Int. Cl.
*H03F 3/04* (2006.01)
*G11C 16/04* (2006.01)
(Continued)

(52) U.S. Cl.
CPC .......... *G11C 16/0408* (2013.01); *G11C 16/10* (2013.01); *G11C 16/12* (2013.01); *G11C 16/26* (2013.01); *G11C 29/021* (2013.01); *G11C 29/028* (2013.01); *H03F 1/0205* (2013.01); *H03F 1/086* (2013.01); *H03F 1/14* (2013.01); *H03F 3/16* (2013.01); *H03F 3/45183* (2013.01); *H03F 3/45475* (2013.01); *H03K 3/012* (2013.01); *H03K 3/353* (2013.01); (Continued)

(58) Field of Classification Search
CPC ....................................................... H03F 3/04
USPC .................................. 330/296, 297, 260, 255
See application file for complete search history.

(56) References Cited

U.S. PATENT DOCUMENTS 4,764,856 A * 8/1988 Rausch ............. H02M 3/33507
323/285
8,264,282 B1 * 9/2012 Riekki .................... H03F 1/301
330/260

(Continued)

FOREIGN PATENT DOCUMENTS

EP           1 892 600         2/2008

OTHER PUBLICATIONS

Chong et al: "Cross Feedforward Cascade Compensation for Low-Power Three-Stage Amplifier With Large Capacitive Load", IEEE Journal of Solid-State Circuits, vol. 47, No. 9, Aug. 21, 2012 (Aug. 21, 2012), pp. 2227-2234.

(Continued)

*Primary Examiner* — Patricia T Nguyen
(74) *Attorney, Agent, or Firm* — Allen, Dyer, Doppelt, Milbrath & Gilchrist, P.A.

(57) ABSTRACT

An input signal is amplified into an output signal that is to be applied to an electrical load including a capacitive component. An amplifier stage includes a pre-amplifier module to receive a first supply voltage, and an output module to receive a second supply voltage. The pre-amplifier module includes a first gain block to pre-amplify the input signal into a first pre-amplified signal, and a second gain block to pre-amplify the input signal into a second pre-amplified signal. A feedback block feeds back the output signal as a feedback signal. A combination element combines the first pre-amplified signal and the feedback signal into a combined signal. The output module combines the combined signal and the second pre-amplified signal into the output signal.

18 Claims, 4 Drawing Sheets

(51) Int. Cl.

| | |
|---|---|
| *G11C 16/12* | (2006.01) |
| *H03F 1/08* | (2006.01) |
| *H03F 1/14* | (2006.01) |
| *H03F 3/45* | (2006.01) |
| *G11C 16/10* | (2006.01) |
| *G11C 16/26* | (2006.01) |
| *H03F 1/02* | (2006.01) |
| *H03F 3/16* | (2006.01) |
| *H03K 3/012* | (2006.01) |
| *H03K 3/353* | (2006.01) |
| *G11C 29/02* | (2006.01) |

(52) U.S. Cl.
 CPC ... *H03F2200/129* (2013.01); *H03F 2200/153* (2013.01); *H03F 2200/45* (2013.01); *H03F 2200/516* (2013.01); *H03F 2203/45138* (2013.01); *H03F 2203/45364* (2013.01); *H03F 2203/45511* (2013.01); *H03F 2203/45512* (2013.01)

(56) References Cited

U.S. PATENT DOCUMENTS

| | | | |
|---|---|---|---|
| 2006/0267687 A1* | 11/2006 | Gammie | H03F 1/34 330/260 |
| 2008/0025077 A1 | 1/2008 | Scheuerlein et al. | |
| 2009/0202259 A1* | 8/2009 | Tourette | G01J 1/44 398/202 |
| 2009/0278600 A1* | 11/2009 | Ikeda | H03F 3/19 330/253 |
| 2014/0361837 A1* | 12/2014 | Strange | H03F 1/0222 330/297 |

OTHER PUBLICATIONS

Giustolisi et al: "Robust Miller Compensation With Current Amplifiers Applied to LDO Voltage Regulators", IEEE Transactions on Circuits and Systems 1: vol. 59, No. 9, Aug. 24, 2012 (Aug. 24, 2012), pp. 1880-1893.

* cited by examiner

AMPLIFIER STAGE

FIELD OF THE INVENTION

The present disclosure relates to the field of electronics, and more particularly, to amplifier stages.

BACKGROUND OF THE INVENTION

Amplifier stages are a key part of many electronic systems. A generic amplifier stage allows amplifying (even just by regenerating it) an electrical signal being input thereto. In this way, subsequent processing of the signal performed by additional components of the electronic system downstream form the amplifier stage is simplified. Accordingly, the design requirements of the downstream components of the amplifier stage are less stringent.

An example application of the amplifier stages is the generation of control signals in non-volatile memories, such as FLASH-type memories.

FLASH memories have a wide diffusion in various types of electronic devices (from smart cards to data storage systems). A generic FLASH memory comprises a plurality of memory cells arranged in a matrix having a plurality of rows and columns. As it is known, each memory cell comprises a floating gate transistor, which is used to store information (for example, one bit) on the basis of a quantity of charge carriers (such as electrons or holes) trapped in its gate which is electrically floating.

The charge carriers are injected into and extracted from the floating gate by stimulating physical phenomena such as Fowler-Nordheim (FN) tunneling or Hot Carrier Injection (HCI, such as Channel Hot Electron—CHE). In order to stimulate such a physical phenomena, high bias voltages to be applied to the memory cells (e.g., on the order of tens of volts) are generally required.

In addition, it is also necessary to be able to vary such bias voltages fast so as to perform sequences of erase operations, program and verify operations, and read operations in the memory cells of the FLASH memory.

The generation of the bias voltages is performed by a pulse generator element within a read/write unit of the FLASH memory selectively connected to each memory cell by corresponding signal lines (such as word lines and bit lines). This pulse generator element comprises a Digital-to-Analog Converter (DAC) for generating an (analog low-voltage) version of each bias voltage. The analog low-voltage is supplied to an amplifier stage that amplifies the bias voltage into a range of values comprising those required to operate on the selected memory cell (or on more selected memory cells simultaneously).

The amplifier stage generally comprises a pre-amplifier transconductance module (e.g., a Transconductance Operational Amplifier—OTA) that receives the bias voltage from the DAC, and an output amplification module that provides the amplified bias voltage. Generally, the (transconductance) pre-amplifier module and the output (amplification) module are connected in such a way to form a feedback loop.

The performance of the amplifier stage (e.g., in terms of speed for the same power consumption) is heavily affected by a capacitive load connected at its output. However, in the specific case of the non-volatile memories, this capacitive load is extremely variable (e.g., in a range on the order of hundreds of pF) according to the state of the selected memory cells. Therefore, also the performance of the amplifier stage is not uniform between different operations since the charging and discharging times of the capacitive load vary according to the capacitive load. It may generate significant over- and under-elongations compared to the desired values of the bias voltage.

In the art, inside the amplifier stage discharge circuits are implemented for speeding up a discharge operation of the capacitive load, so as to increase the performance in terms of speed. Unfortunately, such a device involves a substantial asymmetry between the charging and discharging phases of the capacitive load.

Furthermore, in order to obtain values of the bias voltage higher than a power supply voltage of the FLASH memory (e.g., necessary to stimulate the FN tunneling) the output amplifying element is supplied via a voltage multiplier circuit, such as a charge pump. The charge pump uses capacitive elements to provide voltage values higher than the value of the supply voltage, so that the power that may be supplied by the charge pump is limited (as depending on the electrical charge accumulated in these capacitive elements).

Unfortunately, direct electrical currents of the output module (e.g., a bias current and a leakage current) and of the discharge circuits (electrically coupled with the charge pump) may significantly increase the static power consumption of the amplifier stage (reducing the performance from a power consumption point of view).

SUMMARY OF THE INVENTION

In general terms, the present disclosure is based on the idea of implementing a feedback branch adapted to compensate the influence of the capacitive load.

In particular, one aspect provides an amplifier stage in which a first pre-amplified signal may be combined with a feedback signal into a combined signal, which in turn may be combined with a second pre-amplified signal into an output signal.

The present disclosure, as well as additional features and its advantages, will be better understood with reference to the following detailed description, given purely by way of indication and without limitation. The detailed description is to be read in conjunction with the attached figures (wherein corresponding elements are denoted with equal or similar references and their explanation is not repeated for the sake of brevity).

BRIEF DESCRIPTION OF THE DRAWINGS

The figures are not necessarily to scale (with some details that may be exaggerated and/or simplified) and that, unless otherwise indicated, they are simply used to conceptually illustrate the described structures and procedures. In particular.

DETAILED DESCRIPTION OF THE PREFERRED EMBODIMENTS

Figure 1:
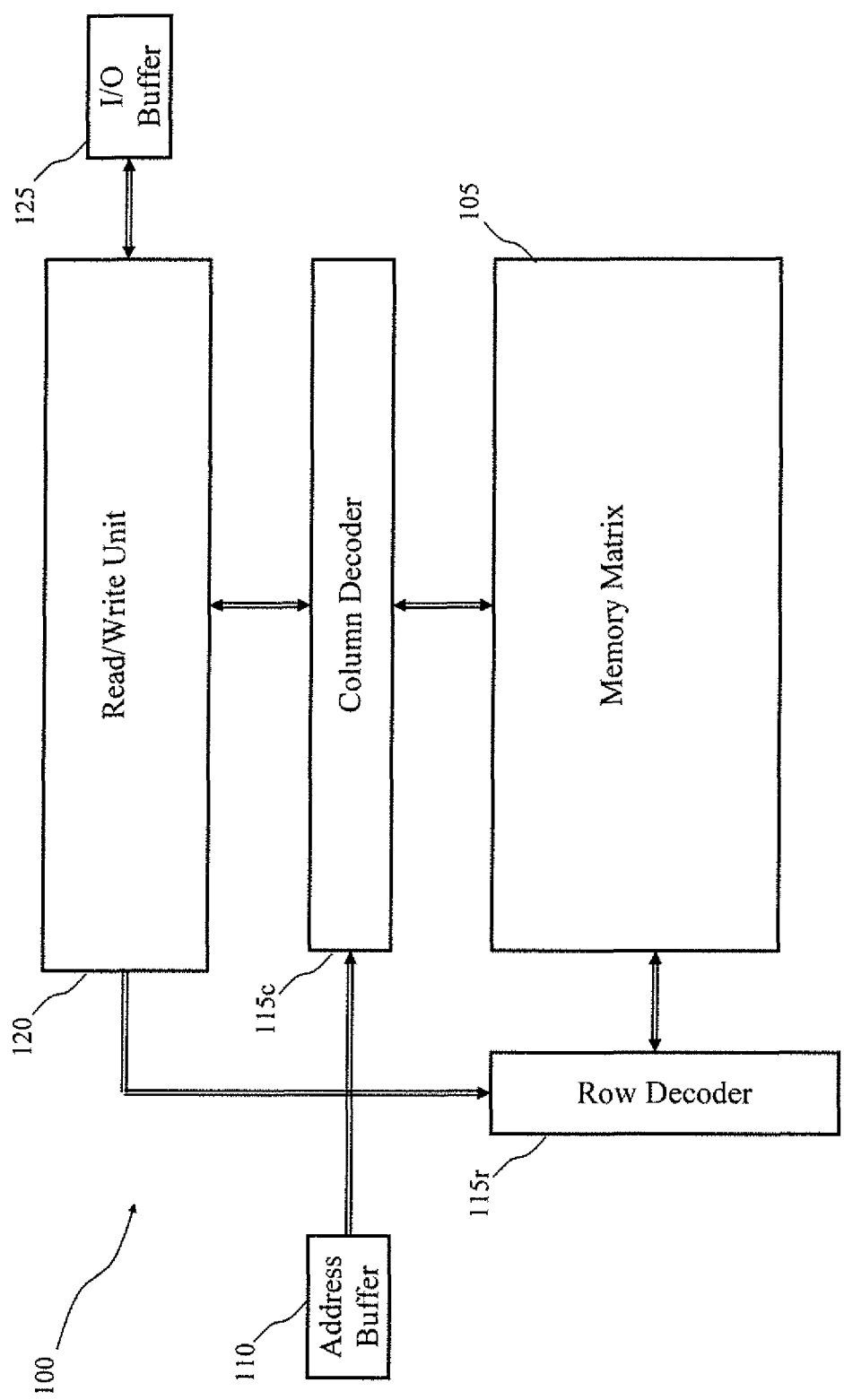
FIG. 1 illustrates a block diagram of a non-volatile memory in which an embodiment of the present disclosure may be used.

Considering FIG. 1, a block diagram of a non-volatile memory 100 (e.g., a FLASH-type memory) is illustrated in which an embodiment of the present disclosure may be used.

The memory device 100 comprises a matrix 105, which is formed by a plurality of memory cells (not shown in the figure) that are organized in rows and columns (e.g., 128-512 rows and 512-1024 columns). Each memory cell stores a logic value (e.g., corresponding to one bit of information). For this purpose, the memory cell may be based on a floating-gate MOS transistor. A MOS transistor has a threshold voltage that depends on an electrical charge stored in its floating gate. The different levels of the threshold voltage represent corresponding logic values. Conventionally, the memory cell is programmed (at a logic value 0) when it has a high threshold voltage, while the memory cell is erased (at a logic value 1) when it has a low threshold voltage.

The electrical charge in the floating gate of each floating gate transistor is changed by a physical phenomena such as Fowler-Nordheim (FN) tunneling, or Hot Carrier Injection (HCI, such as Channel Hot Electron—CHE). In order to stimulate such physical phenomena, high bias voltages (e.g., on the order of some tens of Volts) are applied to each selected memory cell.

To provide the bias voltages mentioned above to the memory cells of the matrix 105, the non-volatile memory 100 comprises the following control circuitry.

An address buffer 110 receives an address of a word (e.g., 8-32 bits) that has to be read from or written into a corresponding selected page of memory cells in the matrix 105, or of a selected sector of memory cells of the matrix 105 (e.g., a row) to be deleted. In particular, a portion of the address is supplied to a row decoder 115*r*, which selects the row of the selected word or of the selected sector in the matrix 105. The other portion of the address is instead supplied to a column decoder 115*c*, which selects, within each packet of columns associated with the corresponding i-th position in all the pages, the column of the selected page. In this way, it is possible to (electrically) access each memory cell of the matrix 105.

A read/write unit 120 controls the operation of the row decoder 115*r* and of the column decoder 115*c*. The read/write unit 120 also comprises all the components (such as a power management unit with charge pumps, sense amplifiers, comparators, reference cells, and the like) that are used to write (i.e., program or cancel) the memory cells and to read their logic values. The read/write unit 120 is also coupled with an input/output (I/O) buffer 125. The input/output buffer 125 receives the word to be written in the matrix 105, or it provides the word read from the matrix 105.

The read/write unit 120 comprises at least one pulse generator (not shown in the figure, but described in detail below) for generating programming, erasing, reading and verifying bias voltages that are used to implement such operations (and in general any bias voltage used for biasing the memory cells of the matrix 105).

Figure 2:
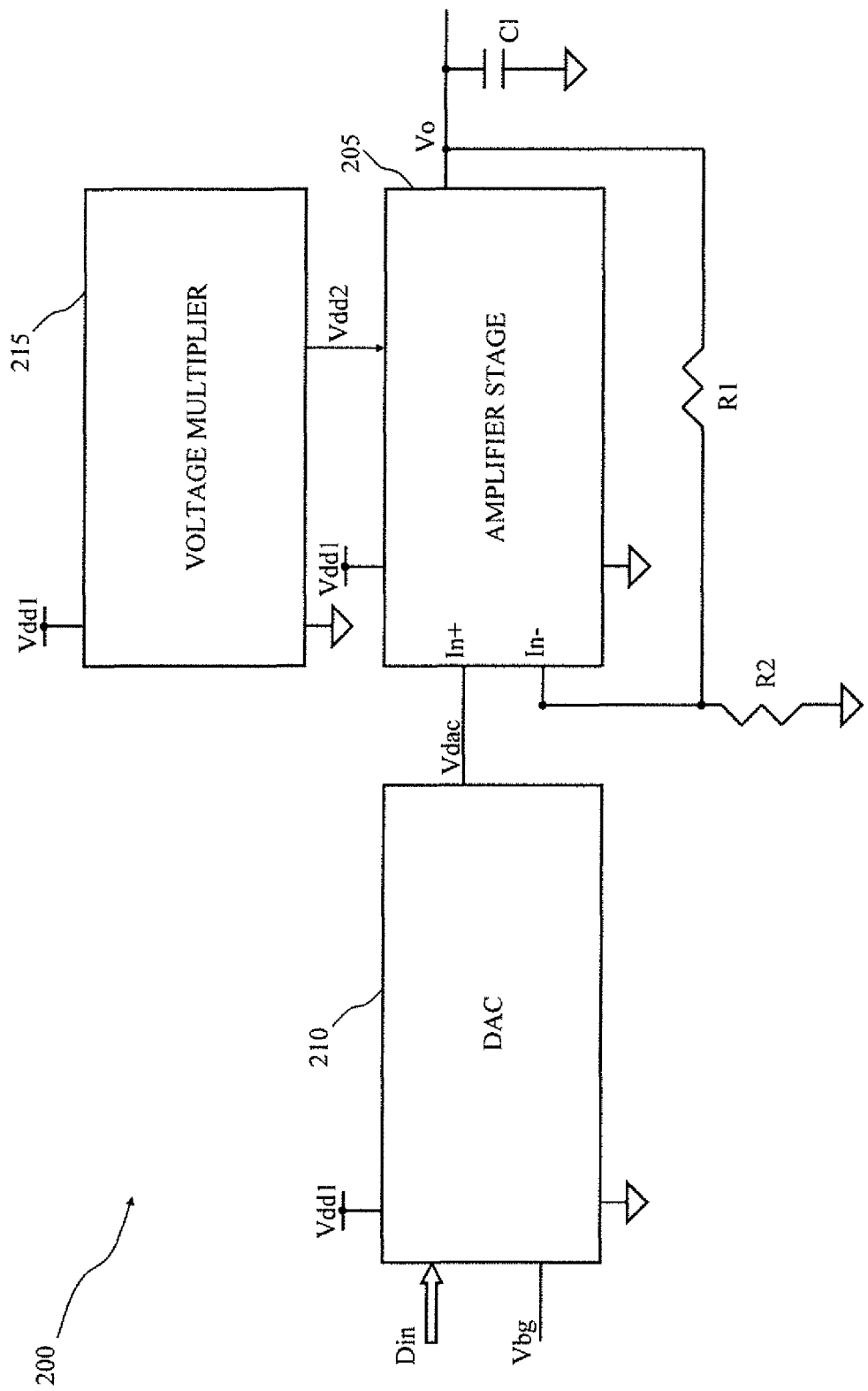
FIG. 2 illustrates an implementation example of a pulse generator element in which an amplifier stage according to an embodiment of the present disclosure may be used.

Turning to FIG. 2, an implementation example of the pulse generator element (indicated with the reference 200) is illustrated in which an amplifier stage 205 according to an embodiment of the present disclosure may be implemented.

The pulse generator element 200 comprises a Digital-to-Analog Converter, or DAC, 210, the amplifier stage 205 and a voltage multiplier, for example, a charge pump 215.

The DAC 210 comprises a digital input terminal for receiving a digital signal Din to be converted (corresponding to a digital representation of a desired low-voltage output signal Vo), a reference input terminal for receiving an operational reference voltage Vbg (e.g., a band gap voltage) and an output terminal for providing an (analog) converted signal Vdac (corresponding to a low-voltage analog version of the desired output signal Vo). In addition, the DAC 210 comprises a power supply terminal for receiving in input a supply voltage Vdd1 and a reference terminal for receiving a supply reference voltage Vgnd (e.g., a ground voltage).

The voltage amplifier stage 205 comprises a first input terminal (in+) coupled with the output terminal of the DAC 210 for receiving the converted signal Vdac, a second input, or feedback, terminal (in−) for receiving a device feedback signal proportional to an output signal Vo generated by the voltage amplifier stage 205, and an output terminal for providing such an output signal Vo corresponding to a desired bias voltage. In addition, the amplifier stage 205 comprises a first power supply terminal for receiving the supply voltage Vdd1, a reference terminal for receiving the reference voltage Vgnd and a second power supply terminal for receiving a boosted supply voltage Vdd2.

The voltage multiplier 215 comprises a power supply terminal for receiving in input the supply voltage Vdd1, a reference terminal for receiving the supply reference voltage Vgnd and an output terminal for providing the boosted supply voltage Vdd2. The supply voltage Vdd2 is generally different from, preferably in absolute value greater than, the supply voltage Vdd1.

Finally, the pulse generator element 200 comprises a feedback element, for example, a pair of resistors R1 and R2 connected in series between the output terminal of the amplifier stage 205 and a reference terminal of the pulse generator element 200. In order to form a feedback loop, a shared terminal of the resistors R1 and R2 is coupled with the second input terminal of the amplifier stage 205.

A capacitor Cl connected to the output terminal of the amplifier stage 205 represents its capacitive load, corresponding to a total capacity of one or more memory cells connected thereto.

During the operation of the pulse generator element 200, the DAC 210 converts the digital signal Din into the corresponding converted signal Vdac. Generally, the digital signal Din comprises (ascending) step portions, i.e., portions in which their value is incremented by a predetermined step (e.g., at regular time intervals determined by a system clock being not shown) until reaching a desired target value (e.g., corresponding to the erase voltage value of the output signal Vo). These ascending step portions are usually followed by abrupt reductions of the value (e.g., corresponding to a range between a few tenths and a dozen Volts of the output signal Vo) for directly providing (lower) bias voltage values adapted to perform a subsequent operation (e.g., a verification of the above-mentioned erase operation) or for providing an initial voltage value for a subsequent step portion.

The (analog) converted signal Vdac received as input by the amplifier stage 205 substantially corresponds to a series of ramps (analog conversion of the step portions of the digital signal Din). The amplifier stage 205 amplifies the converted signal Vdac into the output signal Vo. Generally, the output signal Vo may vary among voltage values greater in absolute value than the value of the supply voltage Vdd1 (for example, necessary for performing the program operations by CHE and the erase operations by FN tunneling on the memory cells) due to the further supply voltage Vdd2 supplied by the voltage multiplier 215.

As a result of the amplifier stage 205 according to an embodiment of the present disclosure, it is possible to make the performance of the pulse generator element 200 (e.g., in terms of speed for the same power consumption) substantially independent of, or at least affected to a reduced extent by, the influence of its capacitive load which has an extremely variable value (e.g., in a range on the order of hundreds of pica-Farad). Therefore, the performance of the amplifier stage is homogeneous among operations (in particular among corresponding operations) and any over- and under-elongations with respect to the desired value of the bias voltage are substantially cut down, or at least reduced in intensity and duration. This is made possible due to the ability of the amplifier stage 205 of compensating for non-idealities introduced by the capacitive load (from a point of view of a transfer function in the frequency domain of the amplifier stage 205) as described below.

Figure 3:
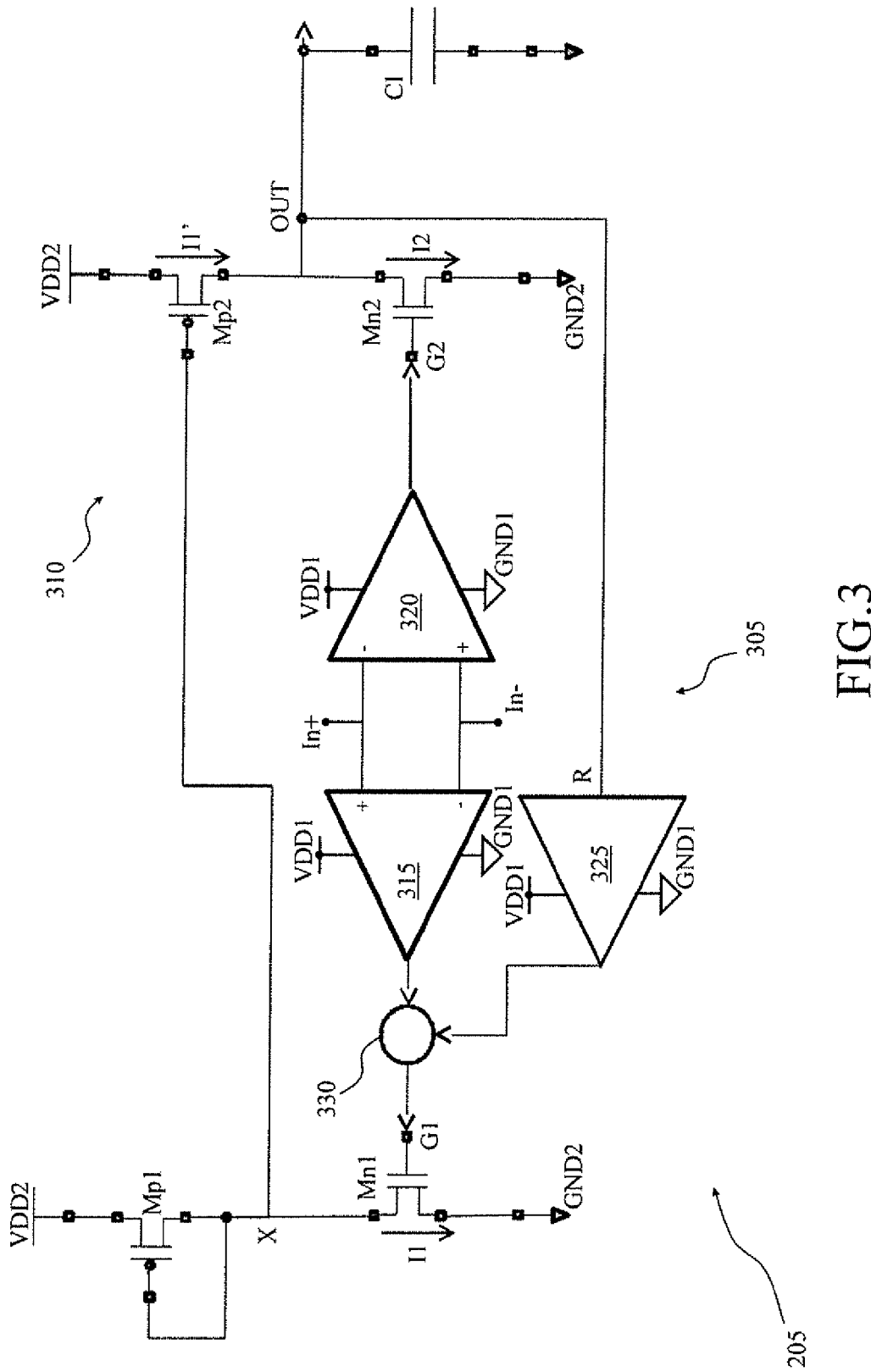
FIG. 3 illustrates a principle circuit diagram of an amplifier stage according to an embodiment of the present disclosure.

Turning now to FIG. 3, a principle circuit diagram of the amplifier stage 205 is illustrated according to an embodiment of the present disclosure. The amplifier stage 205 comprises a pre-amplifier module 305 and an output module 310.

The pre-amplifier module 305 comprises a pair of differential input terminals in+ and in− for receiving a corresponding input signal Vin (e.g., a voltage as the converted signal described above) and the external feedback signal (e.g., a voltage as the device feedback signal described above), respectively, two pre-amplifier terminals G1 and G2 for providing a first pre-amplified signal Vg1 (e.g., a voltage) and a second pre-amplified signal Vg2 (e.g., a voltage), respectively, and a feedback terminal R for receiving a corresponding internal feedback signal Vr.

In addition, the pre-amplifier module 305 comprises a power supply terminal VDD1 for receiving the supply voltage Vdd1, and a reference terminal GND1 for receiving the reference voltage Vgnd.

The output module 310 comprises a pair of input terminals, each coupled with a corresponding one of the pre-amplifier terminals G1 and G2 for receiving the first pre-amplified signal Vg1 and the second pre-amplified signal Vg2, respectively, and an output terminal OUT for providing the output signal Vo to the capacitive load Cl.

In addition, the output module 310 comprises a power supply terminal VDD2 for receiving the boosted supply voltage Vdd2, and a reference terminal GND2 for receiving the reference voltage Vgnd.

Preferably, the feedback terminal R of the pre-amplifier module 305 is coupled with the output terminal OUT of the output module 310, and thus the feedback signal corresponds to the output signal Vo. In this way, the pre-amplifier module 305 and the output module 310 are coupled one with the other to form a feedback loop (as described below).

In greater detail, the pre-amplifier module 305 comprises a non-inverting gain block 315, an inverting gain block 320 and a feedback gain block 325. The blocks 315, 320 and 325 comprise a block power supply terminal coupled with the supply terminal VDD1 of the pre-amplifier module 305 and a block reference terminal coupled with the reference terminal GND1 of the pre-amplifier module 305.

The non-inverting gain block 315 is characterized by a transfer function $A1(s)$ (described below) and comprises a non-inverting input terminal coupled with the positive differential input terminal in+, an inverting input terminal coupled with the negative differential input terminal in−, and an output terminal coupled with the first pre-amplifier terminal G1 by means of a combination node 330.

The inverting gain block 320 is characterized by a transfer function $A2(s)$ (described below) and comprises an inverting input terminal coupled with the positive differential input terminal in+, a non-inverting input terminal coupled with the negative differential input terminal in− and an output terminal coupled with the second pre-amplifier terminal G2. As a result of the connections just described the second pre-amplified signal Vg2 has an inverse trend with respect to the input signal Vin.

The feedback block 325 is characterized by a transfer function $-Ar(s)$ (described below) and comprises an input terminal coupled with the feedback terminal R and an output terminal coupled with the first pre-amplifier terminal G1 by the combination node 330.

The output module 310 substantially defines a current mirror and comprises four transistors (e.g., of the MOSFET type), of which two transistors Mp1 and Mp2 have a first type of conductivity, for example, p-channel MOS transistors, and two transistors Mn1 and Mn2 with a second type of conductivity, for example, re-channel MOS transistors. Preferably, the transistors Mn1 and Mn2 are formed so as to have substantially corresponding operating parameters, such as, for example, a transconductance $gmn_o$ and an operating resistivity $rn_o$. Preferably, also the transistors Mp1 and Mp2 are formed in such a way to have substantially corresponding operating parameters, such as, for example, a transconductance $gmp_o$ and an operating resistivity $rp_o$.

The configuration of the current mirror comprises a first branch in which a source terminal of the transistor Mp1 is coupled with the power supply terminal VDD2 of the output module 310, a drain terminal of the transistor Mp1 is coupled with a node X being shared with its gate terminal, a drain terminal of the transistor Mn1 and a gate terminal of the transistor Mp2. A source terminal of the transistor Mn1 is coupled with the reference terminal GND2 of the output module 310, while a gate terminal of the transistor Mn1 is coupled with the input terminal of the output module 310 being coupled with the first pre-amplifier terminal G1.

The configuration of the current mirror comprises a second branch in which a source terminal of the transistor Mp2 is coupled with the power supply terminal VDD2 of the output module 310, a drain terminal of the transistor Mp2 is coupled with the output terminal OUT with which a drain terminal of the transistor Mn2 is coupled as well. A source terminal of the transistor Mn2 is coupled with the reference terminal GND2 of the output module 310, while a gate terminal of the transistor Mn2 is coupled with the input terminal of the output module 310 being coupled with the second pre-amplifier terminal G2.

In the following a transfer function $T(s)$ of the amplifier stage 205 just described is defined (i.e., a ratio between the output signal Vo and the input signal Vin).

In response to the application of a differential input signal Vin, the non-inverting gain block 315 provides an amplified signal $A1(s) \cdot \text{Vin}$ to its output terminal, which amplified signal is combined in the combination node 330 with a feedback signal $-Ar(s) \cdot \text{Vo}$ supplied to the output terminal of the feedback block 325. The combination of the amplified signal and the feedback signal defines the first pre-amplified signal Vg1, namely:

$$Vg1 = A1(s) \cdot Vin - Ar(s) \cdot Vo. \tag{1}$$

On the other hand, the second gain block 320 provides an amplified signal $-A2(s) \cdot \text{Vin}$ to its output terminal, which amplified signal defines the second pre-amplified signal Vg2, namely:

$$Vg2 = A2(s) \cdot Vin. \tag{2}$$

The first amplified signal Vg1 applied to the gate terminal of the transistor Mn1 generates a first electrical current I1 (with $I1 = gmn_o \cdot Vg1$) between the source and drain terminals of the transistor Mn2. Similarly, the second amplified signal Vg2 applied to the gate terminal of the transistor Mn2 generates a second electrical current I2 ($I2 = gmn_o \cdot Vg2$) between the source and drain terminals of the transistor Mn2.

The first electrical current generated by the transistor Mn1 also crosses the transistor Mp1 and, due to the connection of the gate of the transistor Mp2 to the node X, it induces a replica electrical current I1' (ideally with I1'=I1 when Mp1 and Mp2 have the same operating parameters) between the drain and source terminals of the transistor Mp2.

The replica electrical current I1' and the second electrical current I2 flow in the resistive parallel $rn_o//rp_o$ defined by the operating resistances $rn_o$ and $rp_o$ of the transistors Mn2 and Mp2 and produce, at the output terminal OUT of the output module, the output signal Vo, namely:

$$Vo = Ao1(s) \cdot Vg1 + Ao2(s) \cdot Vg2, \quad (3)$$

where $Ao1(s)$ is the transfer function of the output module 310 that amplifies the first pre-amplified signal Vg1 provided to the first pre-amplifier terminal G1, while $Ao2(s)$ is the transfer function of the output module 310 that amplifies the second pre-amplified signal Vg2 provided to the second pre-amplifier terminal G2. Advantageously, due to the the provision of transistors with corresponding operational parameters described above, it follows that:

$$Ao = |Ao_1(s)| = |Ao_2(s)| = gmn_i(rn_o//rp_o). \quad (4)$$

Therefore the transfer function of the amplifier stage 205 may be defined as:

$$Vo = Ao_1(s) \cdot Vg1 + Ao_2(s) \cdot Vg2$$

$$Vo = Ao_1(s) \cdot [A1(s) \cdot Vin - Ar(s) \cdot Vo] - Ao_2(s) \cdot A2(s) \cdot Vin; \quad (5)$$

$$Vo \cdot [1 + Ao_1(s) \cdot Ar(s)] = Vin \cdot [Ao_1(s) \cdot A1(s) - Ao_2(s) \cdot A2(s)]$$

By considering the two gain blocks 315 and 320 having substantially equal parameters it follows that:

$$A1(s) = -A2(s) = Ag(s). \quad (6)$$

According to such hypothesis, the expression (3) simplifies as follows:

$$Vo \cdot [1 + Ao_1(s) \cdot Ar(s)] = Vin \cdot Ag(s) \cdot [Ao_1(s) - Ao_2(s)], \quad (7)$$

thus:

$$Vo = Vin \cdot \frac{Ag(s) \cdot [Ao_1(s) - Ao_2(s)]}{[1 + Ao_1(s) \cdot Ar(s)]}, \quad (8)$$

from which:

$$T(s) = \frac{Vo}{Vin} = \frac{Ag(s) \cdot [Ao_1(s) - Ao_2(s)]}{[1 + Ao_1(s) \cdot Ar(s)]}. \quad (9)$$

As described in detail below, the transfer function T(s) of the amplifier stage 205 according to an embodiment of the present disclosure provides an amplification At substantially proportional to the product of a gain $|Ag(s)| = Ag$ provided by each of the inverting blocks 320/non-inverting blocks 315, and a gain $|Ao1(s)| = |Ao2(s)| = Ao$ provided by the output module 310. Particularly, the equality $|Ao1(s)| = |Ao2(s)|$ is verified since the transistors Mn1 and Mn2 and the transistors Mp1 and Mp2 are formed with operating parameters substantially equal to each other, respectively.

Otherwise, due to the feedback loop a feedback gain $|Ar(s)| = Ar$ provided by the feedback block 325 allows determining a dominant pole of the transfer function T(s).

In this way, it is possible to design the amplifier stage 205 ensuring a stability thereof over a wide range of frequencies, and thus maintaining substantially constant the amplification At of the amplifier stage also in response to an input signal Vin rapidly variable in time (without causing distortions in the output signal Vo).

Figure 4:
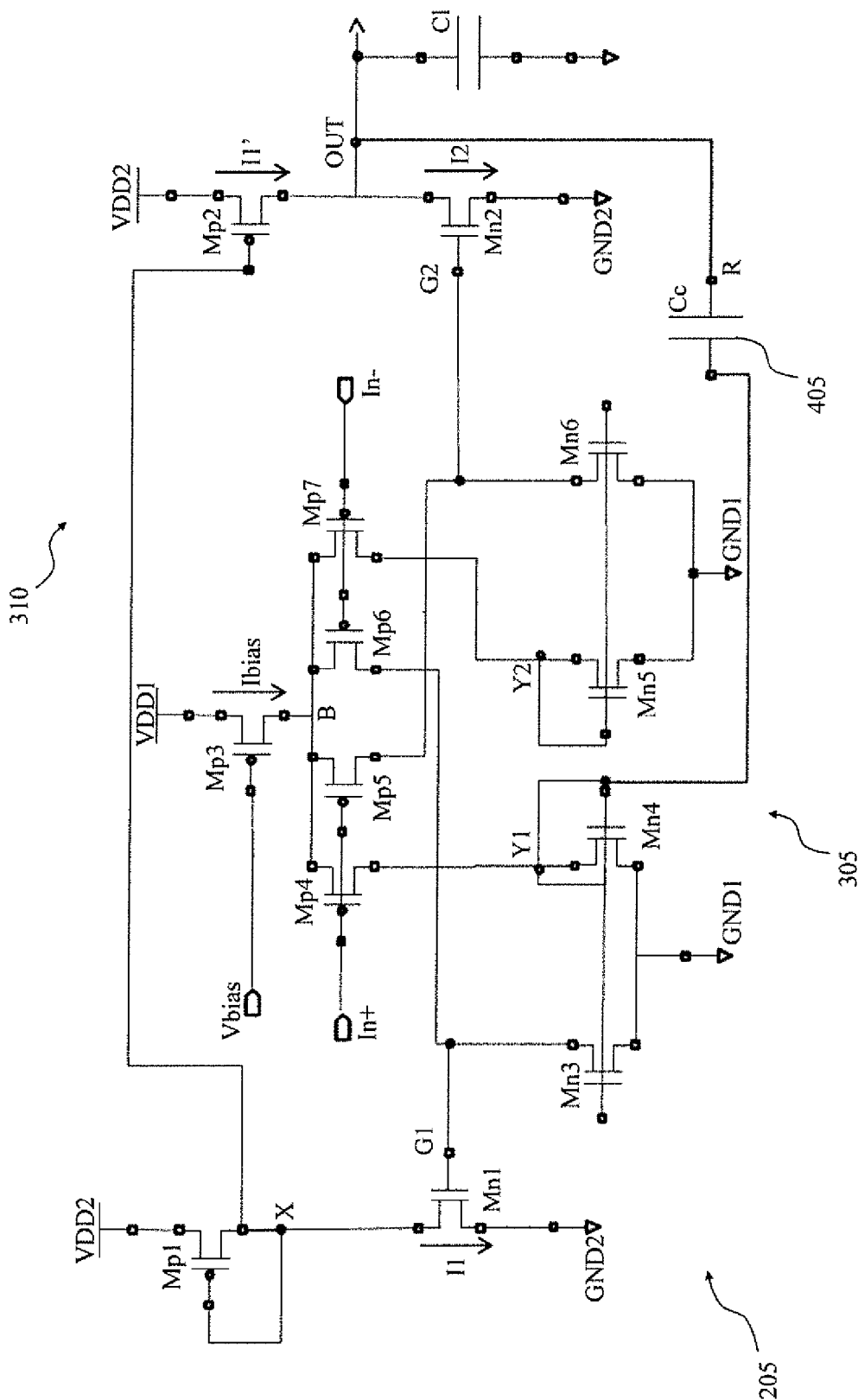
FIG. 4 illustrates a more detailed principle circuit diagram of the amplifier stage of FIG. 3.

Turning now to FIG. 4, a more detailed principle circuit diagram of the amplifier stage 205 is illustrated. In particular, in FIG. 4 an implementation of the pre-amplifier module 305 according to an embodiment of the present disclosure is illustrated.

The pre-amplifier module 305 comprises five transistors Mp3, Mp4, Mp5, Mp6 and Mp7 of the first conductivity type, e.g., p-channel MOS transistors, and four MOS transistors Mn3, Mn4, Mn5 and MN6 of the second conductivity type, e.g., n-channel MOS transistors. In addition, the pre-amplifier module 305 also comprises a compensating capacitive element 405, for example, a capacitor having a capacitance Cc, hereinafter called compensating element 405 for brevity.

Preferably, the p-channel transistors Mp3, Mp4, Mp5, Mp6 and Mp7 are formed so as to have substantially corresponding operating parameters, such as, for example, a transconductance $gmp_d$ and an operating resistivity $rp_d$ (in general, with $gmp_d \neq gmp_o$ and $rp_d \neq rp_o$). Preferably, also the n-channel MOS transistors Mn3, Mn4, Mn5 and MN6 are formed in such a way to have substantially corresponding operating parameters, such as, for example, a transconductance $gmn_d$ and an operating resistivity $rn_d$ (in general, with $gmn_d \neq gmn_o$ and $rn_d \neq rn_o$).

The structure of the pre-amplifier module 305 is the following. The transistor Mp3 comprises a source terminal coupled with the power supply terminal VDD1 of the pre-amplifier module 305, a gate terminal coupled with a bias block (not shown) for receiving a bias signal Vbias (e.g., a voltage) and a drain terminal coupled with a dispensing node B.

The remaining p-channel transistors Mp4, Mp5, Mp6 and Mp7 each comprise a respective source terminal coupled with the dispensing node B.

Furthermore, the transistors Mp4 and Mp5 each comprise a respective gate terminal coupled with the positive input terminal in+ of the pre-amplifier module 305. Similarly, the transistors Mp6 and Mp7 each comprise a respective gate terminal coupled with the negative input terminal in− of the pre-amplifier module 305.

In addition, the transistor Mp5 comprises a drain terminal coupled with the second pre-amplifier terminal G2 of the pre-amplifier module 305 which is also coupled with a drain terminal of the transistor Mn6. Similarly, the transistor Mp6 comprises a drain terminal coupled with the first pre-amplifier terminal G1 of the pre-amplifier module 305 which is also coupled with a drain terminal of the transistor Mn3.

Conversely, the transistor Mp4 comprises a drain terminal coupled with a node Y1 with which a drain terminal and a gate terminal of the transistor Mn4 and a gate terminal of the transistor Mn3 are coupled as well.

In addition, also a first plate terminal of the compensating element 405 is coupled with the node Y1, while a second plate terminal is coupled with the output terminal OUT of the output module 310 (through the feedback terminal R of the pre-amplifier module 305). In other words, the connection made by the compensating element between the pre-amplifier module 305 and the output module 310 defines an (internal) feedback branch of the amplifier stage 205.

Advantageously, the compensating element 405 allows electrically decoupling the pre-amplifier module 305 from the output module 310. In this way it is possible to obtain a feedback loop that is not affected by the different supply voltages Vdd1 and Vdd2 provided to the pre-amplifier module 305 and to the output module 310, respectively.

The transistor Mp7 comprises a drain terminal coupled with a node Y2 with which a drain terminal and a gate terminal of transistor Mn5 and a gate terminal of the transistor MN6 are coupled as well.

Finally, the n-channel transistors Mn3, Mn4, Mn5 and MN6 each comprise a respective source terminal coupled with the reference terminal GND1 of the pre-amplifier module 305.

In the structure described above, the transistors Mp4, Mp6, Mn3 and Mn4 define the non-inverting gain block 315 shown in FIG. 1, and the transistors Mp5, Mp7, Mn5 and MN6 define the inverting gain block 320. In addition, the transistors Mp4, Mp6, Mn3, Mn4 and the capacitive element define the feedback block 325 and the combination element 330.

The structure of the pre-amplifier module 305 just described defines the transfer function T(s) of the amplifier stage 205 in the following way. Firstly, the gain Ag of the inverting block 315 and of the non-inverting block 320 may be defined as:

$$Ag = gmp_d \cdot (rp_d // rn_d). \quad (8)$$

It should be observed that the gain Ag is the same for both the blocks 315 and 320, as both comprise substantially equivalent structures and transistors with corresponding operating parameters (as described above). In detail, for the non-inverting block 315, the transconductance $gmp_d$ refers to the transistors Mp4 and Mp6, while the resistive parallel $rp_d//rn_d$ corresponds to the parallel of the operating resistances of the transistors Mp6 and Mn3. Similarly, for the inverting block 320, the transconductance $gmp_d$ refers to the transistors Mp5 and Mp7, while the resistive parallel rpd//rnd corresponds to the parallel of the operating resistances of the transistors Mp5 and Mn6.

The transfer function Ag(s) has two characteristic angular frequencies $\omega_{g1}$ e $\omega_{g2}$:

$$\omega_{g1} = \frac{1}{C_g(rp_d // rn_d)}, e \quad (9)$$

$$\omega_{g2} = \frac{gmn_d}{Cn2},$$

where Cg is an equivalent capacitive load of the pre-amplifier terminals G1 or G2 (according to whether the gain of the block 315 or of the block 320, respectively, is considered), Cn2 is an equivalent capacitive load of the nodes Y1 or Y2 (according to whether the gain of the block 315 or of the block 320, respectively, is considered), and the transconductance $gmn_d$ relates to the transistor Mn4 or Mn5 (according to whether the gain of the block 315 or of the block 320, respectively, is considered). The characteristic angular frequencies define two poles and a zero in the transfer function Ag(s), which may be expressed as:

$$Ag(s) = Ag \frac{\left(\frac{s}{2\omega_{g2}} + 1\right)}{\left(\frac{s}{\omega_{g1}} + 1\right)\left(\frac{s}{\omega_{g2}} + 1\right)}. \quad (10)$$

With respect to the transfer function Ar(s) of the feedback block 325, it is possible to define a feedback gain value Ar as $$Ar = Cc(rp_d // rn_d), \quad (11)$$

where the resistive parallel $rp_d//rn_d$ corresponds to the parallel of the operating resistances of the transistors Mp6 e Mn3.

The transfer function Ar(s) has a characteristic angular frequency $\omega_r$:

$$\omega_r = \frac{gmn_d}{Cc}, \quad (12)$$

where $gmn_d$ is the transconductance of the transistor Mn4. Such an angular frequency $\omega_r$ determines a pole in the transfer function Ar(s) of the feedback block:

$$Ar(s) = Ar \frac{s}{\left(\frac{s}{\omega_r} + 1\right)}. \quad (13)$$

In addition, it is possible to define the transfer function $Ao_1(s)$ and $Ao_2(s)$ of the output module 310 as well with greater detail.

In detail, the transfer function $Ao_1(s)$ has two angular frequencies $\omega_{o1}$ e $\omega_{o2}$:

$$\omega_{o1} = \frac{1}{Cl(rp_o // rn_o)}, \text{ and} \quad (14)$$

$$\omega_{o2} = \frac{gmp_o}{Cp},$$

where the resistive parallel $rn_o//rp_o$ is defined by the operating resistances $rn_o$ e $rp_o$ of the transistors Mn2 e Mp2, Cp is an equivalent capacitive load of the node X, and $gmp_o$ is the transconductance of the transistor Mp1.

The characteristic angular frequencies determine two poles in the transfer function $Ao_1(s)$, which may be expressed as:

$$Ao_1(s) = Ao \frac{1}{\left(\frac{s}{\omega_{o1}} + 1\right)\left(\frac{s}{\omega_{o2}} + 1\right)}. \quad (15)$$

Conversely, the transfer function $Ao_2(s)$ only has the characteristic angular frequency $\omega_{o1}$, which determines a single pole, and thus may be expressed as:

$$Ao_2(s) = Ao \frac{1}{\left(\frac{s}{\omega_{o1}} + 1\right)}. \quad (16)$$

Accordingly, the transfer function T(s) of the amplifier stage may be defined as:

$$T(s) = 2AoAg(s) \frac{\left(\frac{s}{2\omega_{o2}} + 1\right)}{\left(\frac{s}{\omega_c} + 1\right)}, \quad (17)$$

where the characteristic angular frequency $\omega_c$ is defined as:

$$\omega_c = \frac{1}{ArAo}. \quad (18)$$

Therefore, the pole defined by the characteristic angular frequency $\omega_c$ may be precisely defined in the design phase.

Preferably, the value of the characteristic angular frequency $\omega_c$ (equal to the inverse of the product of the gains of the feedback block 325 and of the output module 310) allows sizing the corresponding pole in order to correspond to a very low frequency (i.e., close to a zero frequency, for example, from a frequency of a few Hertz to a frequency in the order of hundreds of Hertz).

In this way, the pole due to the characteristic angular frequency $\omega_c$ becomes the dominant pole of the transfer function T(s) and gives improved reliability to the amplifier stage 205.

In particular, the gain Ar of the feedback block 325 may be sized so as to obtain an amplifier stage capable of providing an amplification substantially constant over a wide range of operating frequencies when the amplifier stage is implemented in an electronic device, such as the pulse generator element comprising a feedback loop (different from that defined by the feedback block 325) previously described. Doing so it is possible to substantially cancel, or at least reduce, amplitude and duration of spurious over- and under-elongations of the output signal Vo around the desired value of the bias voltage.

In addition, a response speed (or slew rate) of the amplifier stage 205 to a value of the output signal Vo (in response to an input signal Vi) may be determined by sizing the feedback block 325.

In particular, the compensating element 405 may be sized in such a way to make the response speed substantially independent, within a wide range of operating frequency values, from the value of the capacitive load Cl coupled with the output terminal OUT of the amplifier stage 205.

The compensating element 405 allows also defining the response speed with a desired value, since a value of the response speed is substantially defined by a relationship between a bias current Ibias (supplied by the transistor Mp3 biased by the bias voltage Vbias) of the amplifier stage and the capacity Cc of the compensating element 405.

This is very advantageous in applications where the capacitive load Cl varies in time and/or according to an operation to be implemented (such as in the case of the biasing of the memory cells in a non-volatile memory). In fact, with this arrangement it is possible to determine a common maximum desired response speed regardless of an instantaneous value of the capacitive load Cl coupled with the output terminal OUT of the stage.

The amplifier stage 205 according to the present disclosure may be sized for having a symmetric charging and discharging of the capacitive load and it does not require the need for a special discharge circuit in order to speed up the discharge of the capacitive load Cl (as instead it happens in the prior art).

The absence of a discharge circuit reduces a static (biasing) power consumption removing contributions associated with leakage currents due to the discharge circuit. In addition, also a discharge control circuit, delegated to activate/deactivate the discharge circuit, may be omitted, thereby allowing saving the area required to implement such a discharge control circuit and saving power needed to supply the discharge control circuit.

Advantageously, the static power consumption of the entire amplifier stage 205 may be simply adjusted by the bias current Ibias supplied by the transistor Mp3 and having an intensity defined by the bias voltage Vbias. In fact, the bias current Ibias is divided equally between the transistors Mp4-Mp7 connected to the dispensing node B through the respective drain terminals (since such transistors Mp4-Mp7 have corresponding operational parameters). Therefore, the bias current Ibias determines (in combination with the supply voltage Vdd1) a static power consumption for the pre-amplifier module 305.

At the same time, the fraction (substantially corresponding to Ibias/4) of the bias current Ibias flowing through the transistors Mp5 and Mp6 determines corresponding bias voltages for the transistors Mn1 and Mn2 of the output module 310. Such bias voltages determine the respective bias currents that determine the static power consumption of the output module (in combination with the supply voltage Vdd2).

Naturally, in order to satisfy local and specific requirements, a person skilled in the art may apply to the approach described above many logic and/or physical modifications and alterations. More specifically, although this approach has been described with a certain degree of particularity with reference to one or more embodiments thereof, it should be understood that various omissions, substitutions and changes in the form and details as well as other embodiments are possible. Particularly, different embodiments of the invention may even be practiced without the specific details (such as the numerical examples) set forth in the preceding description to provide a more thorough understanding thereof.

Conversely, well-known features may have been omitted or simplified in order not to obscure the description with unnecessary particulars. Moreover, it is expressly intended that specific elements and/or method steps described in connection with any embodiment of the disclosed approaches may be incorporated in any other embodiment as a matter of general design choice.

In any case, the terms comprising, including, having and containing (and any of their forms) should be understood with an open and non-exhaustive meaning (i.e., not limited to the recited elements), the terms based on, dependent on, according to, function of (and any of their forms) should be understood as a non-exclusive relationship (i.e., with possible further variables involved) and the term a should be understood as one or more elements (unless expressly stated otherwise).

For example, one embodiment provides an amplifier stage adapted to amplify an input signal into an output signal to be applied to an electrical load comprising at least one capacitive component. The amplifier stage comprises a pre-amplifier module adapted to receive a first supply voltage, and an output module adapted to receive a second supply voltage. The pre-amplifier module comprises a first gain block adapted to pre-amplify the input signal into a first pre-amplified signal, and a second gain block adapted to pre-amplify the input signal into a second pre-amplified signal. A feedback block is adapted to feed-back the output signal into a feedback signal. A combination element is adapted to combine the first pre-amplified signal and the feedback signal into a combined signal. The output module is adapted to combine the combined signal and the second pre-amplified signal into the output signal.

However, the amplifier stage may comprise any number of additional modules. Similarly, the pre-amplifier module may comprise any type and number of additional blocks. The modules and blocks may be made in any way (see below).

In one embodiment, the feedback block comprises a capacitive compensating element. However, the capacitive compensating element may be of any type (for example, a MOS capacitor).

In one embodiment, the compensating element is sized to define a dominant pole of a transfer function of the amplifier stage. However, nothing prevents sizing the compensating element for defining a pole different from a dominant pole, or a zero, of the transfer function of the amplifier stage.

In one embodiment, the second gain block is suitable to pre-amplify the input signal into the second pre-amplified signal in such a way that the pre-amplified signal has an inverse sign trend with respect to the input signal. The second gain block may be adapted to pre-amplify the input signal into the second pre-amplified signal in a non-inverting way.

In one embodiment, the pre-amplifier module has a supply terminal for receiving the first supply voltage, a reference terminal for receiving a reference voltage, a first input terminal and a second input terminal for receiving the input signal and the feedback signal, respectively, a first pre-amplifier terminal for providing the first pre-amplified signal, and a second pre-amplifier terminal for providing the second pre-amplified signal. Moreover, the pre-amplifier module comprises a first MOS transistor, a second MOS transistor, a third MOS transistor, a fourth MOS transistor and a fifth MOS transistor of a first type, and a sixth MOS transistor, a seventh MOS transistor, an eighth MOS transistor and a ninth MOS transistor of a second type. Each transistor has a source terminal, a drain terminal and a gate terminal.

A bias block has a bias terminal for providing a bias voltage. The source terminal of the first MOS transistor is connected to the supply terminal. The gate terminal of the first MOS transistor is connected to the bias terminal. The gate terminal of the second MOS transistor and of the third MOS transistor are connected to the first input terminal. The gate terminal of the fourth MOS transistor and of the fifth MOS transistor are connected to the second input terminal. The drain terminal of the first MOS transistor and the source terminals of the second, third, fourth and fifth MOS transistors are connected together. The drain terminal of the second MOS transistor, the gate terminal of the sixth MOS transistor and the drain terminal and the gate terminal of the seventh MOS transistor are connected to a first terminal of the compensating element.

The drain terminal of the fifth MOS transistor is connected to the drain terminal and to the gate terminal of the eighth MOS transistor and to the gate terminal of the ninth MOS transistor. The drain terminal of the fourth MOS transistor and the drain terminal of the sixth MOS transistor are connected to the first pre-amplifier terminal. The drain terminal of the third transistor and the drain terminal of the ninth transistor are connected to the second pre-amplifier terminal. The source terminal of the sixth, seventh, eighth and ninth MOS transistors are connected to the reference terminal.

However, nothing prevents implementing the pre-amplifier module in an equivalent manner, as well as the transistors may be of a different type (for example, BJT or JFET).

In one embodiment, the output module has a further supply terminal for receiving the second supply voltage, a further reference terminal for receiving the reference voltage, a further first input terminal connected to the first pre-amplifier terminal for receiving the first pre-amplified signal, a further second input terminal connected to the second pre-amplifier terminal for receiving the second pre-amplified signal, and an output terminal for providing the output signal.

Moreover, the output module comprises a further first and a further second MOS transistor of the second type, and a further third and a further fourth MOS transistor of the second type, each having a source terminal, a drain terminal and a gate terminal. The source terminal of the further first MOS transistor and of the further second MOS transistor are connected to the further supply terminal. The drain terminal of the further second MOS transistor and of the further fourth MOS transistor and a second terminal of the compensating element are connected to the output terminal.

The drain and the gate terminals of the further first MOS transistor, the drain terminal of the further third MOS transistor and the gate terminal of the further second MOS transistor are connected together. The gate terminal of the further third MOS transistor is connected to the further first input terminal. The gate terminal of the further fourth MOS transistor is connected to the further second input terminal. The source terminals of the further third MOS transistor and of the further fourth MOS transistor are connected to the further reference terminal.

Nothing prevents implementing the output module in an equivalent manner, as well as the transistors may be of a different type (for example, BJT or JFET).

In one embodiment, the transistors of the first type of the pre-amplifier module are formed with first common operating parameters different from further common first operating parameters of the transistors of the first type of the output module. The transistors of the second type of the pre-amplifier module are formed with second common operating parameters different from further common second operating parameters of the transistors of the second type of the output module. However, the operating parameters of the transistors may have a different relationship among them (for example, everyone different from each other).

A different aspect of the present disclosure proposes a pulse generator element comprising the amplifier stage, a converter element for receiving a digital signal corresponding to the input signal and the first supply voltage, and for converting the digital signal into the input signal. A feedback element is connected to an output terminal and an input terminal of the amplifier stage for providing a feedback loop, and a voltage multiplier element for generating the second supply voltage from the first supply voltage.

However, the pulse generator device may comprise additional elements of any type and in any number. In any case, the amplifier stage may be used in any other application.

A different aspect of the present disclosure proposes a non-volatile memory comprising a plurality of memory cells, and a read/write unit for performing read/write operations on at least one selected memory cell. The read/write unit comprises at least one pulse generator element each for providing the corresponding output voltage to the selected memory cells. In any case, the pulse generator may be used in other types of memory, or more generally in any other application.

Generally, similar considerations apply if the amplifier stage, the pulse generator element and the non-volatile memory each has a different structure or comprises equivalent components (for example, of different materials), or it has other operative characteristics. In any case, every component thereof may be separated into more elements, or two or more components may be combined together into a single element. Moreover, each component may be replicated to support the execution of the corresponding operations in parallel. It should also be noted that (unless specified otherwise) any interaction between different components generally does not need to be continuous, and it may be either direct or indirect through one or more intermediaries.

Moreover, the approach described above may be part of the design of an integrated circuit. The project may also be created in a hardware description language. In addition, if the designer does not manufacture the chips or masks, the project may be physically transmitted to others. In any case, the resulting integrated circuit may be distributed by its manufacturer in the form of raw wafer, as a bare die, or in packages.

A different aspect of the present disclosure proposes a method for amplifying an input signal into an output signal to be applied to an electrical load comprising at least one capacitive component. The method comprises the following steps. A first supply voltage is provided to a pre-amplifier module and a second power supply voltage is provided to an output module.

The input signal is pre-amplified into a first pre-amplified signal by a first gain block of the pre-amplifier module. The input signal is pre-amplified into a second pre-amplified signal by a second gain block of the pre-amplifier module. The output signal is fed-back into a feedback signal by a feedback block of the pre-amplifier module. The first pre-amplified signal and the feedback signal are combined into a combined signal by a combination element of the pre-amplifier module. The combined signal and the second pre-amplifier signal are combined into the output signal by the output module.

In general, similar considerations may be applied if the same approach is implemented by an equivalent method (by using similar steps with the same functions of several steps or portions thereof, by removing some non-essential steps, or by adding additional optional steps). Moreover, the steps may be performed in a different order, in parallel or overlapped (at least in part).

The invention claimed is:

1. An amplifier stage to amplify an input signal into an output signal to be applied to an electrical load comprising at least one capacitive component, the amplifier stage comprising:
   a pre-amplifier module to receive a first supply voltage and comprising
      a first gain block to pre-amplify the input signal into a first pre-amplified signal,
      a second gain block to pre-amplify the input signal into a second pre-amplified signal,
      a feedback block to feed-back the output signal as a feedback signal, and
      a combination element to combine the first pre-amplified signal and the feedback signal into a combined signal; and
   an output module to receive a second supply voltage and combining the combined signal and the second pre-amplified signal into the output signal.

2. The amplifier stage according to claim 1, wherein said feedback block comprises a capacitive compensating element.

3. The amplifier stage according to claim 2, wherein said capacitive compensating element is sized to define a dominant pole of a transfer function of the amplifier stage.

4. The amplifier stage according to claim 1, wherein said second gain block pre-amplifies the input signal into the second pre-amplified signal so that the second pre-amplified signal has an inverse sign with respect to the input signal.

5. The amplifier stage according to claim 2, wherein said pre-amplifier module has a supply terminal for receiving the first supply voltage, a reference terminal for receiving a reference voltage, a first input terminal and a second input terminal for receiving the input signal and the feedback signal, respectively, a first pre-amplifier terminal for providing the first pre-amplified signal, and a second pre-amplifier terminal for providing the second pre-amplified signal, said pre-amplifier module comprising:
   a first MOS transistor, a second MOS transistor, a third MOS transistor, a fourth MOS transistor and a fifth MOS transistor of a first type, each having a source terminal, a drain terminal and a gate terminal;
   a sixth MOS transistor, a seventh MOS transistor, an eighth MOS transistor and a ninth MOS transistor of a second type, each having a source terminal, a drain terminal and a gate terminal;
   a bias block having a bias terminal for providing a bias voltage;
   the source terminal of said first MOS transistor is connected to the supply terminal;
   the gate terminal of said first MOS transistor is connected to the bias terminal;
   the gate terminal of said second MOS transistor and of said third MOS transistor are connected to the first input terminal;
   the gate terminal of said fourth MOS transistor and of said fifth MOS transistor are connected to the second input terminal;
   the drain terminal of said first MOS transistor and the source terminals of said second, third, fourth and fifth MOS transistors are connected together;
   the drain terminal of said second MOS transistor, the gate terminal of said sixth MOS transistor and the drain terminal and the gate terminal of said seventh MOS transistor are connected to a first terminal of said capacitive compensating element;
   the drain terminal of said fifth MOS transistor is connected to the drain terminal and to the gate terminal of said eighth MOS transistor and to the gate terminal of said ninth MOS transistor;
   the drain terminal of said fourth MOS transistor and the drain terminal of said sixth MOS transistor are connected to the first pre-amplifier terminal;
   the drain terminal of said third transistor and the drain terminal of said ninth transistor are connected to the second pre-amplifier terminal; and
   the source terminal of said sixth, seventh, eighth and ninth MOS transistors are connected to the reference terminal.

6. The amplifier stage according to claim 5, wherein said output module has a further supply terminal for receiving the second supply voltage, a further reference terminal for receiving the reference voltage, a further first input terminal connected to the first pre-amplifier terminal for receiving the first pre-amplified signal, a further second input terminal connected to the second pre-amplifier terminal for receiving the second pre-amplified signal, and an output terminal for providing the output signal, said output module comprising:
- a further first and a further second MOS transistor of the first type, each having a source terminal, a drain terminal and a gate terminal;
- a further third and a further fourth MOS transistor of the second type, each having a source terminal, a drain terminal and a gate terminal;
- the source terminal of said further first MOS transistor and of said further second MOS transistor are connected to the further supply terminal;
- the drain terminal of said further second MOS transistor and of said further fourth MOS transistor and a second terminal of said capacitive compensating element are connected to the output terminal;
- the drain and the gate terminals of said further first MOS transistor, the drain terminal of said further third MOS transistor and the gate terminal of said further second MOS transistor are connected together;
- the gate terminal of said further third MOS transistor is connected to the further first input terminal,
- the gate terminal of said further fourth MOS transistor is connected to the further second input terminal,
- the source terminals of said further third MOS transistor and of said further fourth MOS transistor are connected to the further reference terminal.

7. The amplifier stage according to claim 6, wherein said transistors of the first type of said pre-amplifier module are formed with first common operating parameters different from further common first operating parameters of said transistors of the first type of said output module; and wherein said transistors of the second type of said pre-amplifier module are formed with second common operating parameters different from further common second operating parameters of said transistors of the second type of the output module.

8. A pulse generator element comprising
an amplifier stage to amplify an input signal into an output signal to be applied to an electrical load comprising at least one capacitive component, said amplifier stage comprising:
- a pre-amplifier module to receive a first supply voltage and comprising
  - a first gain block to pre-amplify the input signal into a first pre-amplified signal,
  - a second gain block to pre-amplify the input signal into a second pre-amplified signal,
  - a feedback block to feed-back the output signal as a feedback signal, and
  - a combination element to combine the first pre-amplified signal and the feedback signal into a combined signal; and
- an output module to receive a second supply voltage and combining the combined signal and the second pre-amplified signal into the output signal;
- a converter element for receiving a digital signal corresponding to the input signal and the first supply voltage, and for converting the digital signal into the input signal, a feedback element connected to an output terminal and an input terminal of the amplifier stage for providing a feedback loop; and
- a voltage multiplier element for generating the second supply voltage from the first supply voltage.

9. The pulse generator element according to claim 8, wherein said feedback block comprises a capacitive compensating element.

10. The pulse generator element according to claim 9, wherein said capacitive compensating element is sized to define a dominant pole of a transfer function of the amplifier stage.

11. The pulse generator element according to claim 8, wherein said second gain block pre-amplifies the input signal into the second pre-amplified signal so that the second pre-amplified signal has an inverse sign with respect to the input signal.

12. The pulse generator element according to claim 9, wherein said pre-amplifier module has a supply terminal for receiving the first supply voltage, a reference terminal for receiving a reference voltage, a first input terminal and a second input terminal for receiving the input signal and the feedback signal, respectively, a first pre-amplifier terminal for providing the first pre-amplified signal, and a second pre-amplifier terminal for providing the second pre-amplified signal, said pre-amplifier module comprising:
- a first MOS transistor, a second MOS transistor, a third MOS transistor, a fourth MOS transistor and a fifth MOS transistor of a first type, each having a source terminal, a drain terminal and a gate terminal;
- a sixth MOS transistor, a seventh MOS transistor, an eighth MOS transistor and a ninth MOS transistor of a second type, each having a source terminal, a drain terminal and a gate terminal;
- a bias block having a bias terminal for providing a bias voltage;
- the source terminal of said first MOS transistor is connected to the supply terminal;
- the gate terminal of said first MOS transistor is connected to the bias terminal;
- the gate terminal of said second MOS transistor and of said third MOS transistor are connected to the first input terminal;
- the gate terminal of said fourth MOS transistor and of said fifth MOS transistor are connected to the second input terminal;
- the drain terminal of said first MOS transistor and the source terminals of said second, third, fourth and fifth MOS transistors are connected together;
- the drain terminal of said second MOS transistor, the gate terminal of said sixth MOS transistor and the drain terminal and the gate terminal of said seventh MOS transistor are connected to a first terminal of said capacitive compensating element;
- the drain terminal of said fifth MOS transistor is connected to the drain terminal and to the gate terminal of said eighth MOS transistor and to the gate terminal of said ninth MOS transistor;
- the drain terminal of said fourth MOS transistor and the drain terminal of said sixth MOS transistor are connected to the first pre-amplifier terminal;
- the drain terminal of said third transistor and the drain terminal of said ninth transistor are connected to the second pre-amplifier terminal; and
- the source terminal of said sixth, seventh, eighth and ninth MOS transistors are connected to the reference terminal.

13. A non-volatile memory comprising:
a plurality of memory cells; and
a read/write unit for performing read/write operations on at least one selected memory cell, said read/write unit comprising a pulse generator element comprising an amplifier stage to amplify an input signal into an output signal to be applied to an electrical load comprising at least one capacitive component, said amplifier stage comprising:
- a pre-amplifier module to receive a first supply voltage and comprising
  - a first gain block to pre-amplify the input signal into a first pre-amplified signal,
  - a second gain block to pre-amplify the input signal into a second pre-amplified signal,
  - a feedback block to feed-back the output signal as a feedback signal, and
  - a combination element to combine the first pre-amplified signal and the feedback signal into a combined signal; and
- an output module to receive a second supply voltage and combining the combined signal and the second pre-amplified signal into the output signal;
- a converter element for receiving a digital signal corresponding to the input signal and the first supply voltage, and for converting the digital signal into the input signal, a feedback element connected to an output terminal and an input terminal of the amplifier stage for providing a feedback loop; and
- a voltage multiplier element for generating the second supply voltage from the first supply voltage.

14. The non-volatile memory according to claim 13, wherein said feedback block comprises a capacitive compensating element.

15. The non-volatile memory according to claim 14, wherein said capacitive compensating element is sized to define a dominant pole of a transfer function of the amplifier stage.

16. The non-volatile memory according to claim 13, wherein said second gain block pre-amplifies the input signal into the second pre-amplified signal so that the second pre-amplified signal has an inverse sign with respect to the input signal.

17. The non-volatile memory according to claim 13, wherein said pre-amplifier module has a supply terminal for receiving the first supply voltage, a reference terminal for receiving a reference voltage, a first input terminal and a second input terminal for receiving the input signal and the feedback signal, respectively, a first pre-amplifier terminal for providing the first pre-amplified signal, and a second pre-amplifier terminal for providing the second pre-amplified signal, said pre-amplifier module comprising:
- a first MOS transistor, a second MOS transistor, a third MOS transistor, a fourth MOS transistor and a fifth MOS transistor of a first type, each having a source terminal, a drain terminal and a gate terminal;
- a sixth MOS transistor, a seventh MOS transistor, an eighth MOS transistor and a ninth MOS transistor of a second type, each having a source terminal, a drain terminal and a gate terminal;
- a bias block having a bias terminal for providing a bias voltage;
- the source terminal of said first MOS transistor is connected to the supply terminal;
- the gate terminal of said first MOS transistor is connected to the bias terminal;
- the gate terminal of said second MOS transistor and of said third MOS transistor are connected to the first input terminal;
- the gate terminal of said fourth MOS transistor and of said fifth MOS transistor are connected to the second input terminal;
- the drain terminal of said first MOS transistor and the source terminals of said second, third, fourth and fifth MOS transistors are connected together;
- the drain terminal of said second MOS transistor, the gate terminal of said sixth MOS transistor and the drain terminal and the gate terminal of said seventh MOS transistor are connected to a first terminal of said capacitive compensating element;
- the drain terminal of said fifth MOS transistor is connected to the drain terminal and to the gate terminal of said eighth MOS transistor and to the gate terminal of said ninth MOS transistor;
- the drain terminal of said fourth MOS transistor and the drain terminal of said sixth MOS transistor are connected to the first pre-amplifier terminal;
- the drain terminal of said third transistor and the drain terminal of said ninth transistor are connected to the second pre-amplifier terminal; and
- the source terminal of said sixth, seventh, eighth and ninth MOS transistors are connected to the reference terminal.

18. A method for amplifying an input signal into an output signal to be applied to an electric load comprising at least one capacitive component, the method comprising:
- providing a first supply voltage to a pre-amplifier module and a second power supply voltage to an output module;
- pre-amplifying the input signal into a first pre-amplified signal by a first gain block of the pre-amplifier module;
- pre-amplifying the input signal into a second pre-amplified signal by a second gain block of the pre-amplifier module;
- feeding-back the output signal into a feedback signal by a feedback block of the pre-amplifier module;
- combining the first pre-amplified signal and the feedback signal into a combined signal by a combination element of the pre-amplifier module; and
- combining the combined signal and the second pre-amplified signal into the output signal by the output module.

* * * * *